United States Patent
Soeno et al.

(10) Patent No.: US 9,773,883 B2
(45) Date of Patent: Sep. 26, 2017

(54) METHOD FOR MANUFACTURING INSULATED GATE TYPE SWITCHING DEVICE HAVING LOW-DENSITY BODY REGION AND HIGH-DENSITY BODY REGION

(71) Applicants: Akitaka Soeno, Toyota (JP); Yuichi Takeuchi, Obu (JP); Narumasa Soejima, Seto (JP)

(72) Inventors: Akitaka Soeno, Toyota (JP); Yuichi Takeuchi, Obu (JP); Narumasa Soejima, Seto (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/114,461

(22) PCT Filed: Oct. 6, 2014

(86) PCT No.: PCT/JP2014/076721
§ 371 (c)(1),
(2) Date: Jul. 27, 2016

(87) PCT Pub. No.: WO2015/122049
PCT Pub. Date: Aug. 20, 2015

(65) Prior Publication Data
US 2016/0351680 A1 Dec. 1, 2016

(30) Foreign Application Priority Data

Feb. 17, 2014 (JP) ................. 2014-027750

(51) Int. Cl.
*H01L 29/66* (2006.01)
*H01L 29/16* (2006.01)
(Continued)

(52) U.S. Cl.
CPC .... *H01L 29/66068* (2013.01); *H01L 29/1095* (2013.01); *H01L 29/1608* (2013.01);
(Continued)

(58) Field of Classification Search
None
See application file for complete search history.

(56) References Cited

U.S. PATENT DOCUMENTS

2001/0026977 A1  10/2001  Hattori et al.
2008/0012040 A1*  1/2008  Saito ................ H01L 29/0696
257/133

(Continued)

FOREIGN PATENT DOCUMENTS

JP  2001-250947 A  9/2001
JP  2009-194065 A  8/2009
JP  2010-147228 A  7/2010

*Primary Examiner* — Michael Jung
(74) *Attorney, Agent, or Firm* — Oliff PLC

(57) ABSTRACT

A method is provided for manufacturing an insulated gate type switching device. The method includes: implanting second conductivity type impurities into a surface of a semiconductor substrate so as to form a second region of a second conductivity type in the surface; forming a third region of the second conductivity type having a second conductivity type impurity density lower than the second region on the surface by epitaxial growth: and forming a trench gate electrode.

1 Claim, 5 Drawing Sheets

(51) Int. Cl.
  *H01L 29/423* (2006.01)
  *H01L 29/78* (2006.01)
  *H01L 29/10* (2006.01)
  *H01L 29/739* (2006.01)

(52) U.S. Cl.
  CPC .... *H01L 29/4236* (2013.01); *H01L 29/66734* (2013.01); *H01L 29/7395* (2013.01); *H01L 29/7397* (2013.01); *H01L 29/7813* (2013.01)

(56) References Cited

U.S. PATENT DOCUMENTS

| | | |
|---|---|---|
| 2009/0200559 A1 | 8/2009 | Suzuki et al. |
| 2011/0201187 A1* | 8/2011 | Nishiwaki ............ H01L 29/0834 438/529 |
| 2012/0161154 A1* | 6/2012 | Mimura ............... H01L 29/4236 257/77 |
| 2012/0168856 A1* | 7/2012 | Luo ..................... H01L 29/0634 257/330 |
| 2013/0105889 A1* | 5/2013 | Fujiwara ............ H01L 29/66068 257/330 |

* cited by examiner

METHOD FOR MANUFACTURING INSULATED GATE TYPE SWITCHING DEVICE HAVING LOW-DENSITY BODY REGION AND HIGH-DENSITY BODY REGION

This application is a related application of and claims priority to Japanese Patent Application No. 2014-027750 filed on Feb. 17, 2014, the entire contents of which are hereby incorporated by reference into the present application.

The technique disclosed herein relates to an insulated gate type switching device.

BACKGROUND ART

Japanese Patent Application Publication No. 2001-250947 (hereinafter referred to as Patent Document 1) discloses an insulated gate bipolar transistor (IGBT) including an n-base layer, a p-base layer, an n-emitter layer, and a gate electrode. The p-base layer includes a high-density p-base layer in which a p-type impurity density is high, and a low-density p-base layer in which a p-type impurity density is low. The high-density p-base layer is in contact with the n-base layer, and the low-density p-base layer is in contact with the n-emitter layer. When an on-potential is applied to the gate electrode, a channel is formed in the p-base layer, whereby electrons flow from the n-base layer toward the n-emitter layer. In the IGBT, when a voltage between a collector and an emitter becomes larger, a potential of the high-density p-base layer is increased, and the channel formed in the high-density p-base layer is pinched off, thus saturating current flowing through the IGBT. Thus, the IGBT has a high short circuit tolerance. Note that although Patent Document 1 describes a technique for providing the high-density p-base layer in the IGBT, the provision of a high-density p-base layer in other insulated gate type switching devices, such as a metal-oxide-semiconductor field-effect transistor (MOSFET), can also improve the short circuit tolerance.

SUMMARY OF INVENTION

Technical Problem

The above-mentioned high-density p-base layer is normally formed by implanting p-type impurities at a predetermined depth, into a semiconductor substrate. When implanting the p-type impurities, many defects are generated in a semiconductor layer through which the implanted p-type impurities have passed. That is, many defects are formed in the low-density p-base layer that is located at a shallower position than the high-density p-base layer. The low-density p-base layer is a region where a channel is to be formed. If many defects are present in the channel, channel mobility is degraded, thus increasing the on-resistance of the device.

Therefore, the present disclosure herein provides a technique for achieving a high short circuit tolerance and high channel mobility in an insulated gate type switching device.

Solution to Technical Problem

To solve the problem described above, a high-density p-base layer and a low-density p-base layer are proposed to be formed by epitaxial growth. This method can suppress the formation of defects in the low-density p-base layer. However, the formation of the high-density p-base layer by the epitaxial growth makes it difficult to precisely control the impurity density in the high-density p-base layer. As a result, in mass-production of such insulated gate type switching devices, variation in the impurity density in the high-density p-base layer becomes larger, thereby causing a problem of significantly greater variation in gate voltage threshold. Accordingly, the present disclosure herein proposes a method for manufacturing an insulated gate type switching device with the following features.

A method of manufacturing an insulated gate type switching device disclosed herein comprises steps of: implanting second conductivity type impurities into a surface of a semiconductor substrate including a first region of a first conductivity type so as to form a second region of a second conductivity type in a range in the semiconductor substrate that is exposed on the surface; forming a third region of the second conductivity type on the surface by epitaxial growth after the formation of the second region, the third region having a second conductivity type impurity density lower than a second conductivity type impurity density in the second region; forming a fourth region of the first conductivity type being in contact with the third region and separated from the first region by the second and third regions; and forming a trench gate electrode facing the second and third regions via an insulating film.

In the insulated gate type switching device manufactured by this method, a channel is formed in the second region and the third region. In this manufacturing method, first, the second region having the higher second conductivity type impurity density is formed by implanting the second conductivity type impurities. Then, the third region having the lower second conductivity type impurity density is formed on the second region by the epitaxial growth. Since the third region is formed after the second region, no defects are generated in the third region when forming the second region. Therefore, the insulated gate type switching device manufactured by this method has a high channel mobility. Further, in the insulated gate type switching device manufactured by this method, part of the channel is formed in the second region having the higher second conductivity type impurity density. Thus, the insulated gate type switching device has a high short circuit tolerance. Further, since in this method the second conductivity type impurities are implanted to form the second region, the second conductivity type impurity density in the second region can be precisely controlled. Therefore, the insulated gate type switching device manufactured by this method has small variation in the gate voltage threshold.

In the method described above, a first conductivity type impurity density in the third region may be lower than the first conductivity type impurity density in the first region.

With this arrangement, the channel mobility in the third region can be further improved.

Further, a novel insulated gate type switching device is provided herewith. The insulated gate type switching device comprises: a first region of a first conductivity type; a second region of a second conductivity type provided on the first region; a third region of the second conductivity type provided on the second region and having a second conductivity type impurity density lower than a second conductivity type impurity density in the second region; a fourth region of the first conductivity type being in contact with the third region and separated from the first region by the second and the third regions; and a trench gate electrode facing the second and the third regions via an insulating film. First conductivity type impurity densities in the first and second regions are substantially constant. A second conductivity type impurity density distribution in a thickness direction of the second region has a local maximal value. A second conductivity type impurity density in the third region is substantially constant.

This insulated gate type switching device can be manufactured by the method described above. Therefore, the insulated gate type switching device has a high short circuit tolerance and high channel mobility. In mass-production of the insulated gate type switching devices, variation in the gate voltage threshold is less likely to occur. Even in the insulated gate type switching device, the first conductivity type impurity density in the third region may be lower than the first conductivity type impurity density in the first region. Note that the term "substantially constant" as used herein means that a difference between the maximum value and the minimum value of the impurity density in each region is less than a general manufacturing error level.

DESCRIPTION OF EMBODIMENTS

Figure 1:
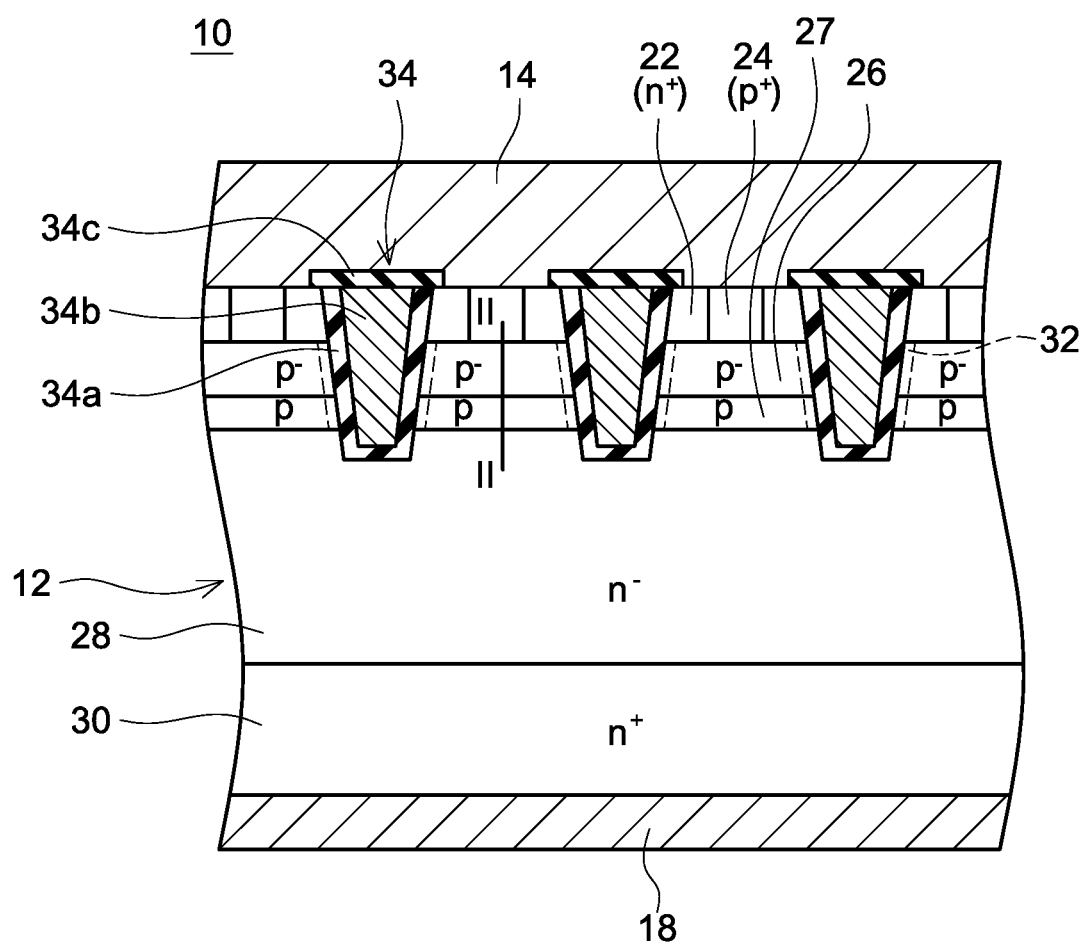
FIG. 1 is a longitudinal cross-sectional view of a semiconductor device 10.

A semiconductor device 10 shown in FIG. 1 comprises a semiconductor substrate 12 made of SiC. A front electrode 14 is provided on a front surface of the semiconductor substrate 12. A rear electrode 18 is provided on a rear surface of the semiconductor substrate 12.

Source regions 22, body contact regions 24, a low-density body region 26, a high-density body region 27, a drift region 28, a drain region 30, and gate trenches 34 are provided in the semiconductor substrate 12.

Each of the source regions 22 is an n-type region that contains n-type impurities (nitrogen in this embodiment) at a high density. The source region 22 is formed in a range exposed on an upper surface of the semiconductor substrate 12. The source region 22 is in ohmic contact with the front electrode 14.

Each of the body contact regions 24 is a p-type region that contains p-type impurities (aluminum in this embodiment) at a high density. The body contact regions 24 are formed to be exposed on the upper surface of the semiconductor substrate 12 in positions where the source regions 22 are not provided. Each body contact region 24 is in ohmic contact with the front electrode 14.

The low-density body region 26 is a p-type region that contains p-type impurities at a low density. The p-type impurity density in the low-density body region 26 is lower than the p-type impurity density in the body contact regions 24. The low-density body region 26 is provided under the source regions 22 and the body contact regions 24 and in contact with these regions.

The high-density body region 27 is a p-type region that contains p-type impurities at a relatively high density. The p-type impurity density in the high-density body region 27 is lower than the p-type impurity density in the body contact regions 24. The p-type impurity density in the high-density body region 27 is higher than the p-type impurity density in the low-density body region 26 (in more detail, an average of the p-type impurity densities in the high-density body region 27 is higher than an average of the p-type impurity densities in the low-density body region 26). The high-density body region 27 is provided under the low-density body region 26, and in contact with the low-density body region 26. The high-density body region 27 is separated from the source regions 22 by the low-density body region 26.

The drift region 28 is an n-type region that contains n-type impurities at a low density. The n-type impurity density in the drift region 28 is lower than the n-type impurity density in the source regions 22. The drift region 28 is provided under the high-density body region 27. The drift region 28 is in contact with the high-density body region 27 and is separated from the low-density body region 26 by the high-density body region 27.

The drain region 30 is an n-type region that contains n-type impurities at a high density. The n-type impurity density in the drain region 30 is higher than the n-type impurity density in the drift region 28. The drain region 30 is provided under the drift region 28. The drain region 30 is in contact with the drift region 28 and is separated from the high-density body region 27 by the drift region 28. The drain region 30 is formed in a range exposed on a lower surface of the semiconductor substrate 12. The drain region 30 is in ohmic contact with the rear electrode 18.

A plurality of gate trenches 34 is provided in the upper surface of the semiconductor substrate 12. Each gate trench 34 is disposed to pass through the corresponding source region 22, the low-density body region 26, and the high-density body region 27 so as to reach the drift region 28. A gate insulating film 34a and a gate electrode 34b are disposed in each gate trench 34. An inner surface of the gate trench 34 is covered with the gate insulating film 34a. The gate electrode 34b is filled in the gate trench 34. The gate electrode 34b extends from the front surface of the semiconductor substrate 12 to a deeper position than the high-density body region 27. The gate electrode 34b is facing the corresponding source region 22, the low-density body region 26, the high-density body region 27, and the drift region 28 via the respective gate insulating film 34a. The gate electrode 34b is insulated from the semiconductor substrate 12 by the respective gate insulating film 34a. An upper surface of the gate electrode 34b is covered with an insulating layer 34c. The gate electrode 34b is insulated from the front electrode 14 by the respective insulating layer 34c.

Figure 2:
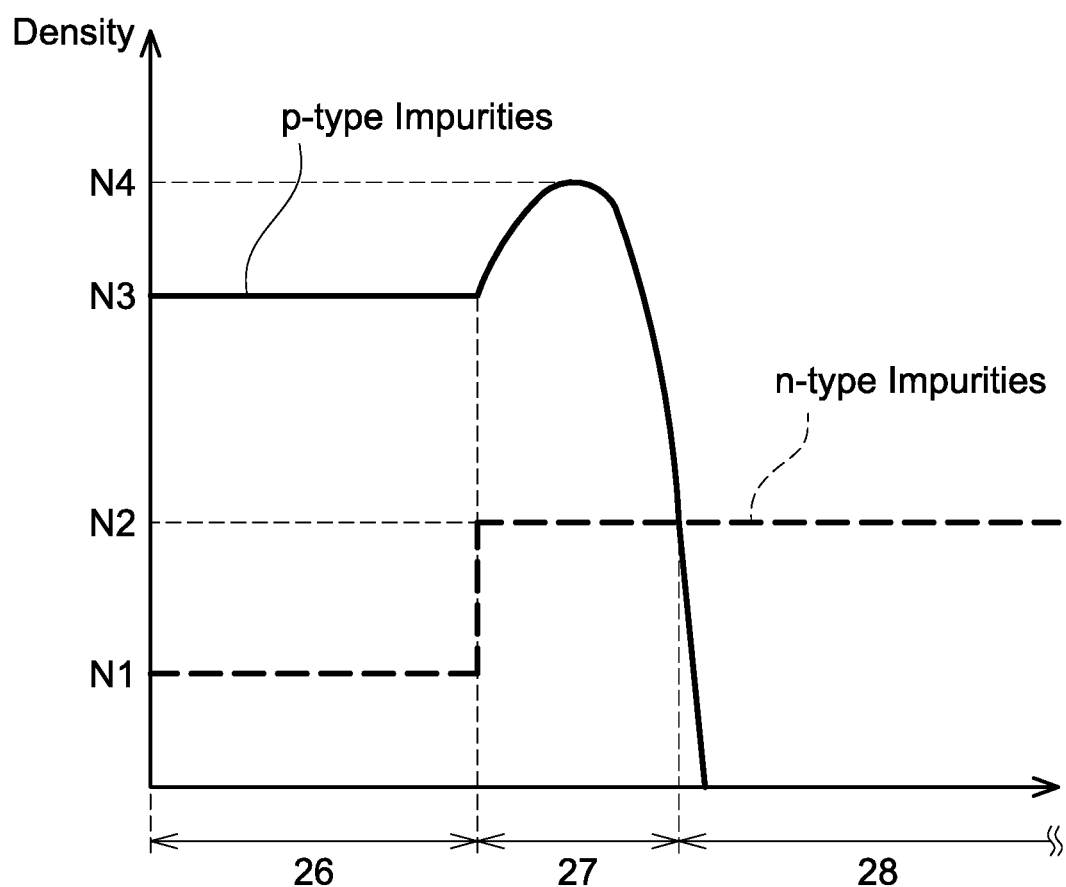
FIG. 2 is a graph showing impurity density distribution taken along line II-II of FIG. 1.

FIG. 2 is a graph showing impurity density distribution taken along line II-II of FIG. 1. That is, FIG. 2 shows the impurity density distribution within the low-density body region 26, the high-density body region 27, and the drift region 28 in a thickness direction of the semiconductor substrate 12.

Within the low-density body region 26, an n-type impurity density is distributed at a substantially constant density N1. Within the high-density body region 27 and the drift region 28, the n-type impurity density is distributed at a substantially constant density N2. The density N2 is higher than the density N1. That is, an average of the n-type impurity densities in the low-density body region 26 is lower than an average of the n-type impurity densities in the high-density body region 27 and the drift region 28. Within the low-density body region 26, a p-type impurity density is distributed at a substantially constant density N3. Within the high-density body region 27, the p-type impurity density is distributed to have a peak density N4. In other words, the p-type impurity density at a depth of an upper end of the high-density body region 27 is the density N3. The p-type impurity density gradually increases from the upper end of the high-density body region 27 toward the drift region 28. The p-type impurity density becomes the peak density N4 at a depth of a substantially center of the high-density body region 27. On a lower side of the depth of the peak density N4, the p-type impurity density gradually decreases toward the drift region 28. The p-type impurity density is substantially zero within the drift region 28. Note that each of the densities N1, N2, and N3 is preferably constant within a corresponding region, but in reality there is variation in the densities N1, N2, and N3 within respective allowable tolerances. Variations in each impurity density can be defined as (Maximum Value−Minimum Value)/{(Minimum Value+Maximum Value)/2}. The variation in the n-type impurity density N1 in the low-density body region 26 is preferably within ±10%. The variation in the p-type impurity density N3 in the low-density body region 26 is preferably within ±10%. The variation in the n-type impurity density in the high-density body region 27 and the drift region 28 is preferably within ±7%.

A MOSFET is provided in the semiconductor substrate 12 by the above-mentioned configurations. When a voltage higher than a threshold is applied to the gate electrodes 34b, a channel 32 is formed in the low-density body region 26 and the high-density body region 27 in vicinity of each gate insulating film 34a (that is, the low-density body region 26 and high-density body region 27 that are sandwiched between the respective source regions 22 and the drift region 28). The channel 32 is formed, thereby allowing electrons to flow from the source regions 22 to the drift region 28. In contrast, when the gate voltage is decreased to a value lower than the threshold, the channel 32 disappears and no electrons flow from the source regions 22 to the drift region 28. That is, the MOSFET is turned off. In the semiconductor device 10 of this embodiment, a channel saturation current of the MOSFET is suppressed to a lower level as will be described below. That is, when an extremely high voltage is applied between the source and drain with the MOSFET turned on, potential of the high-density body region 27 is increased. Then, since a difference in potential between the high-density body region 27 and the gate electrodes 34b is less than the threshold, the channel 32 cannot be maintained at the high-density body region 27, and the channel 32 is pinched off within the high-density body region 27. Due to this, the current flowing through the channel 32 is saturated. In this way, the MOSFET has a low channel saturation current and hence a high short circuit tolerance.

Figure 3:
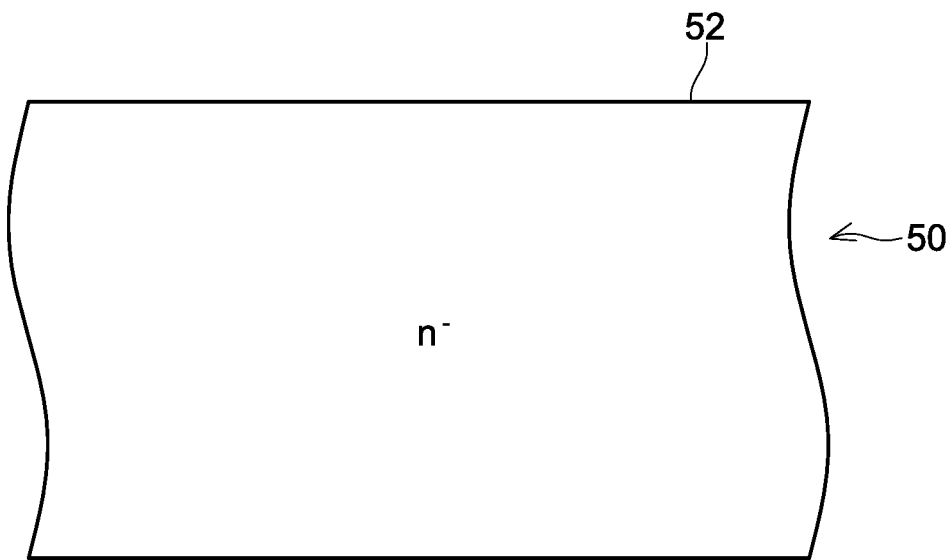
FIG. 3 is an explanatory diagram of a method for manufacturing the semiconductor device 10.
Figure 4:
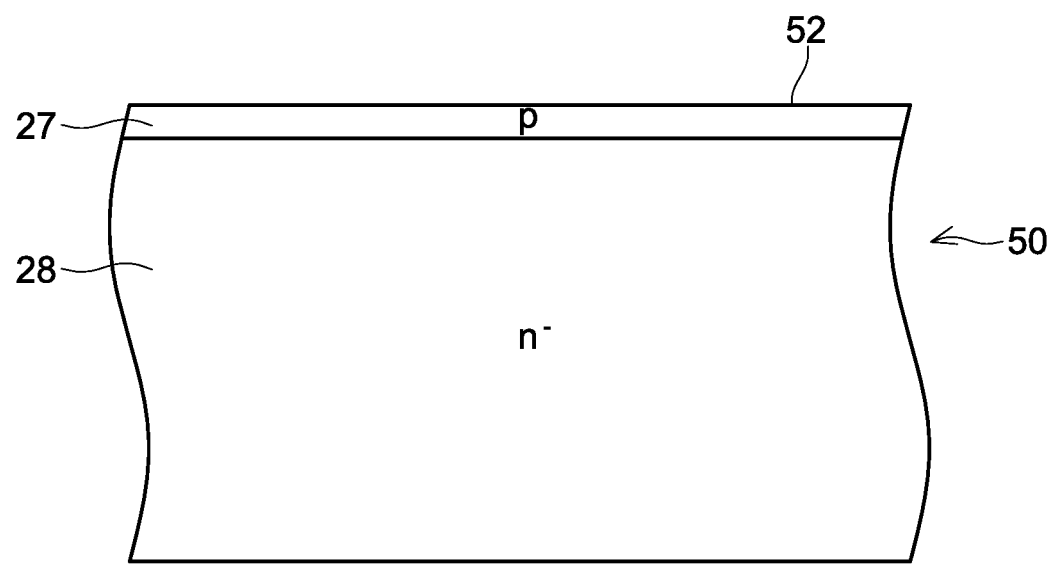
FIG. 4 is another explanatory diagram of the method for manufacturing the semiconductor device 10.

Next, a method of manufacturing the semiconductor device 10 will be described. First, an n-type semiconductor substrate 50 made of SiC is prepared as shown in FIG. 3. N-type impurities are uniformly distributed within the semiconductor substrate 50 substantially at the same density as the density in the drift region 28 described above.

µ-type impurities are ion-implanted into a front surface 52 of the semiconductor substrate 50. Then, the semiconductor substrate 50 is subjected to a heat treatment, thereby diffusing and activating the implanted p-type impurities. Thus, as shown in FIG. 4, the p-type high-density body region 27 is formed in a range of the semiconductor substrate 50 that is exposed on the front surface 52 thereof. An n-type region under the high-density body region 27 corresponds to the drift region 28.

As mentioned above, since the high-density body region 27 is formed by the ion implantation of the p-type impurities, the p-type impurities are distributed in a Gaussian distribution manner within the high-density body region 27 so as to exhibit the peak value N4 as shown in FIG. 2. Since the high-density body region 27 is a region formed by implanting the p-type impurities into the n-type semiconductor substrate 50, the n-type impurity density is made uniform across the high-density body region 27, like the drift region 28, as shown in FIG. 2.

Figure 5:
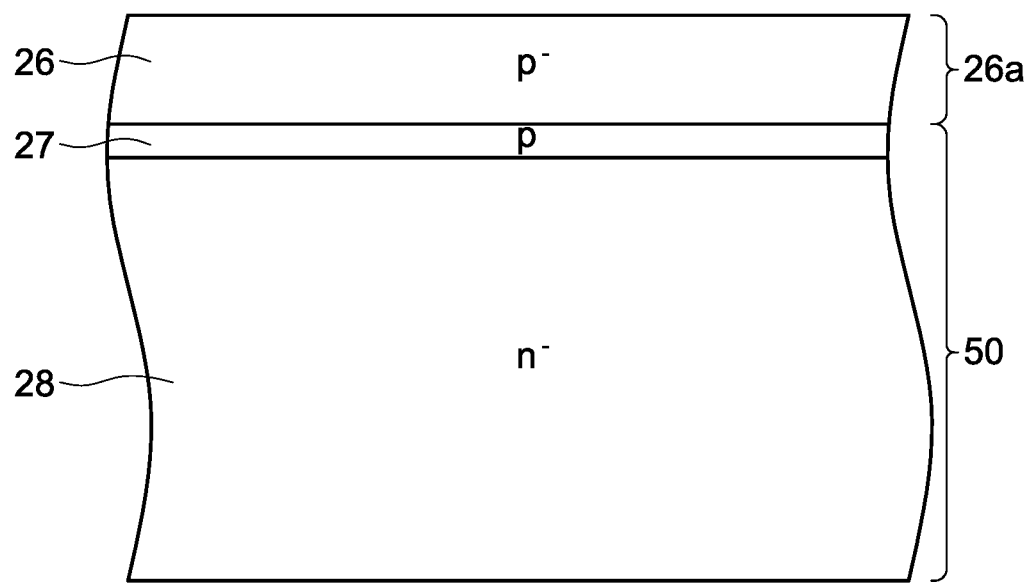
FIG. 5 is another explanatory diagram of the method for manufacturing the semiconductor device 10.

Then, as shown in FIG. 5, a p-type layer 26a made of SiC is formed on the front surface of the semiconductor substrate 12 (that is, on the high-density body region 27) by epitaxial growth. Part of the p-type layer 26a becomes the low-density body region 26 as will be described in detail below. Here, as shown in FIG. 2, process conditions for the epitaxial growth are adjusted such that the p-type impurity density in the p-type layer 26a (that is, the low-density body region 26) is substantially constant at the density N3, and that the n-type impurity density in the p-type layer 26a (that is, the low-density body region 26) is substantially constant at the density N1. The epitaxial growth can form the p-type layer 26a such that the impurity density of each kind of impurities is distributed to be substantially constant as in the distribution in the low-density body region 26 shown in FIG. 2.

Figure 6:
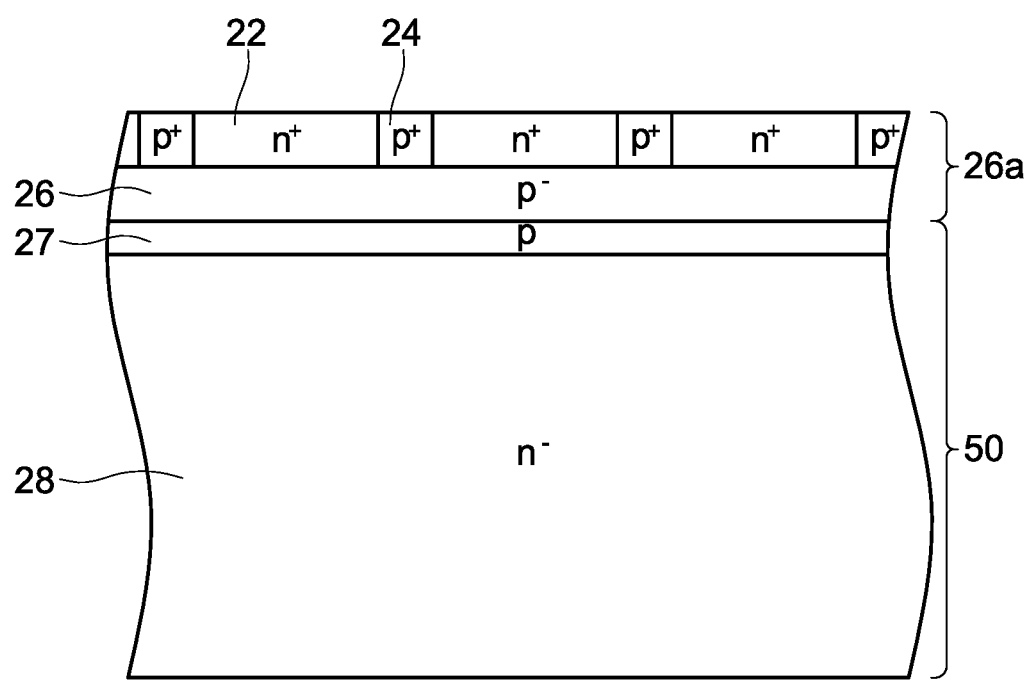
FIG. 6 is another explanatory diagram of the method for manufacturing the semiconductor device 10.

Then, as shown in FIG. 6, the source regions 22 and the body contact regions 24 are formed in a range exposed on the front surface of the p-type layer 26a by ion implantation and thermal diffusion. A lower region of the p-type layer 26a that has not become the source region 22 or the body contact region 24 is the low-density body region 26.

Figure 7:
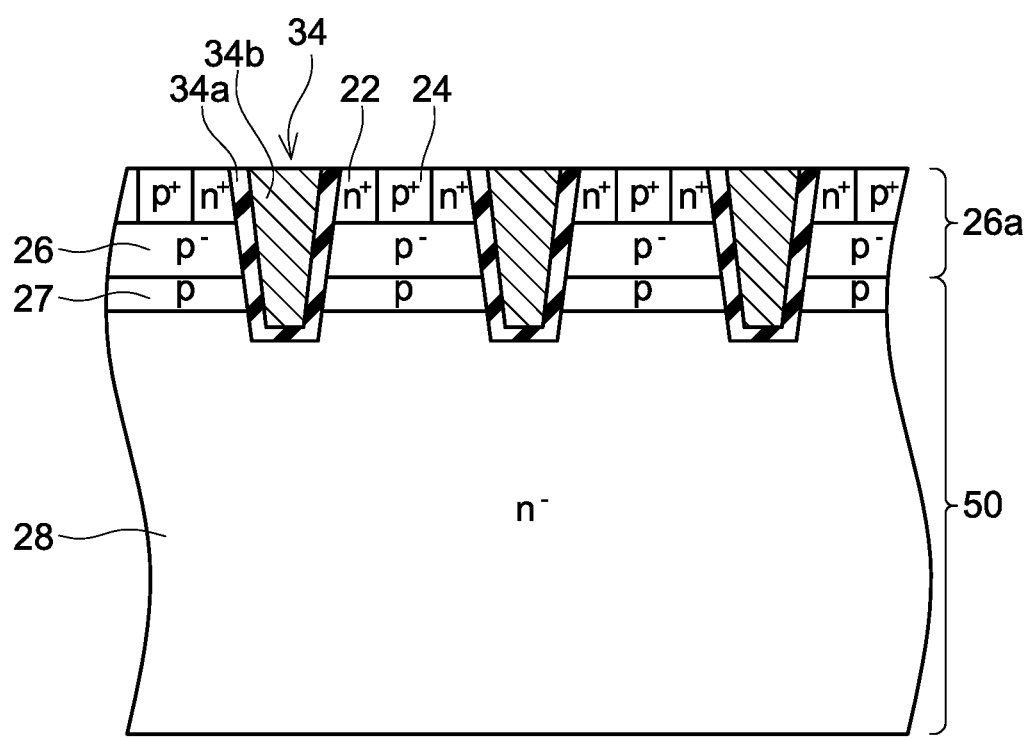
FIG. 7 is another explanatory diagram of the method for manufacturing the semiconductor device 10.

Then, as shown in FIG. 7, gate trenches 34, gate insulating films 34a, and gate electrodes 34b are formed. Thereafter, necessary processing for the front surface side (formation of the front electrode 14 and the like) is performed, and necessary processing for the rear surface side (rear surface polishing, formation of the rear electrode 18, and the like) is performed, thereby completing the manufacturing of the semiconductor device 10 shown in FIG. 1.

In the above-mentioned manufacturing method, after forming the high-density body region 27 by ion implantation as shown in FIG. 4, the low-density body region 26 is epitaxially grown on the high-density body region 27. Thus, the low-density body region 26 is not damaged by the ion implantation for forming the high-density body region 27 (that is, no crystal defects are generated in the low-density body region 26 by the ion implantation for forming the high-density body region 27). Even in the step of forming the source regions 22 and the body contact regions 24 by ion implantation as shown in FIG. 6, the low-density body region 26 is not subjected to ion implantation. Thus, also in this step, crystal defects are barely generated in the low-density body region 26. Thus, an amount of crystal defects existing in the low-density body region 26 is extremely small. As mentioned above, the channel 32 is formed in the low-density body region 26. Since the amount of crystal defects existing in the low-density body region 26 is extremely small, the mobility of the channel 32 formed in the low-density body region 26 is very high. Therefore, the semiconductor device 10 has a low on-voltage.

In the manufacturing method described above, the low-density body region 26 is formed such that the n-type impurity density in the low-density body region 26 is lower than the n-type impurity density in the semiconductor substrate 50. The n-type impurities existing in the channel 32 reduce the mobility of the channel 32 because they scatter the electrons. In the semiconductor device 10, the mobility of the channel 32 formed in the low-density body region 26 is improved also by the n-type impurity density in the low-density body region 26 being lower than the n-type impurity density in the semiconductor substrate 50. Thus, the on-voltage of the semiconductor device 10 is further reduced.

The gate voltage threshold is determined by the p-type impurity density in a region of the channel 32 where the p-type impurity density is the highest. In the above-mentioned embodiment, the gate voltage threshold is determined by the peak density N4 of the p-type impurity density in the high-density body region 27. In the above-mentioned manufacturing method, the high-density body region 27 is formed by ion implantation. The ion implantation can precisely control the p-type impurity density (that is, the peak density N4) in the high-density body region 27. That is, if the high-density body region 27 is supposed to be formed by the epitaxial growth, the impurity density in the epitaxial layer significantly varies depending on an influence of the temperature during the growth step, thus making it difficult to precisely control the density in the high-density body region 27. In contrast, like the above-mentioned embodiment, the case of forming the high-density body region 27 by the ion implantation includes fewer factors that cause variation, compared to the case of forming the high-density body region by the epitaxial growth, and therefore makes it possible to precisely control the p-type impurity density in the high-density body region 27. Therefore, the above-mentioned embodiment can suppress variation in the gate voltage threshold in mass-production of the semiconductor devices 10.

As mentioned above, the manufacturing method and semiconductor device 10 in this embodiment can improve the channel mobility of a MOSFET, improve the short circuit tolerance of a MOSFET, and suppress variation in gate voltage threshold.

Note that although the above-mentioned embodiment has described a MOSFET, the technique disclosed herein may be applied to other insulated gate type switching devices, such as an IGBT. Although in the above-mentioned embodiment, the semiconductor substrate 50 is made of SiC, the technique disclosed herein may be applied to any semiconductor substrate made of another semiconductor material. Note that the technique disclosed herein is useful, particularly, in the semiconductor substrate made of SiC. That is, in the semiconductor substrate made of SiC, an activation rate of the impurities implanted into the semiconductor substrate by the ion implantation is extremely low. Suppose that the impurities are ion-implanted into the low-density body region 26. Most of the implanted impurities are not activated, leaving many crystal defects in the low-density body region 26. For this reason, by applying the technique disclosed herein to the semiconductor substrate made of SiC to avoid the ion implantation into the low-density body region 26, it is possible to drastically improve the channel mobility of an insulated gate type switching device using the SiC. A temperature required to epitaxially grow a SiC layer is approximately 1600° C., which is much higher than the temperature (of approximately 1100° C.) required to grow a Si layer. Thus, it is difficult to control especially its temperature in the step of epitaxially growing the SiC layer. Due to this, variation in impurity density of the epitaxial layer is more likely to be generated. Suppose that the high-density body region 27 made of SiC is formed by epitaxial growth. Variation in the impurity density of the high-density body region 27 is more likely to be generated, and as a result, the gate voltage threshold is likely to vary. In contrast, when the technique disclosed herein is applied to form the high-density body region 27 by the ion implantation, the p-type impurity density of the high-density body region 27 made of SiC can be precisely controlled, thereby significantly improving variation in gate voltage threshold.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified, in the present description or drawings achieves a plurality of objects at the same time, and has technical utility by achieving one of such objects.

The invention claimed is:

1. A method of manufacturing an insulated gate type switching device, the method comprising:
   implanting second conductivity type impurities into a surface of a semiconductor substrate including a first region of a first conductivity type so as to form a second region of a second conductivity type in a range in the semiconductor substrate that is exposed on the surface;
   forming a third region of the second conductivity type on the surface by epitaxial growth after the formation of the second region, the third region having a second conductivity type impurity density lower than a second conductivity type impurity density in the second region and the third region having a first conductivity type impurity density lower than a first conductivity type impurity density in the first region;
   forming a fourth region of the first conductivity type being in contact with the third region and separated from the first region by the second and third regions; and
   forming a trench gate electrode facing the second and third regions via an insulating film.

* * * * *